(12) United States Patent
Kimura et al.

(10) Patent No.: US 8,347,173 B2
(45) Date of Patent: Jan. 1, 2013

(54) CONSTRUCTION OF PARITY-CHECK MATRICES FOR NON-BINARYS LDPC CODES

(75) Inventors: Dai Kimura, Kawasaki (JP); Ramesh Mahendra Pyndiah, Brest Cedex (FR); Frederic Guilloud, Brest Cedex (FR)

(73) Assignees: Fujitsu Limited, Kawasaki (JP); GET/ENST-Bretagne, Brest Cedex (FR)

( * ) Notice: Subject to any disclaimer, the term of this patent is extended or adjusted under 35 U.S.C. 154(b) by 873 days.

(21) Appl. No.: 12/225,796

(22) PCT Filed: Mar. 30, 2006

(86) PCT No.: PCT/EP2006/003789
§ 371 (c)(1),
(2), (4) Date: May 20, 2009

(87) PCT Pub. No.: WO2007/112767
PCT Pub. Date: Oct. 11, 2007

(65) Prior Publication Data
US 2009/0287981 A1  Nov. 19, 2009

(51) Int. Cl.
*H03M 13/00* (2006.01)
*H03M 13/11* (2006.01)
(52) U.S. Cl. .................. 714/758; 714/752; 714/801
(58) Field of Classification Search ............ None
See application file for complete search history.

(56) References Cited

U.S. PATENT DOCUMENTS

| | | | |
|---|---|---|---|
| 2003/0235166 A1* | 12/2003 | Son et al. | 370/334 |
| 2006/0020870 A1* | 1/2006 | Hocevar | 714/752 |
| 2007/0011568 A1* | 1/2007 | Hocevar | 714/758 |
| 2008/0141098 A1* | 6/2008 | Chae et al. | 714/758 |
| 2009/0259915 A1* | 10/2009 | Livshitz et al. | 714/758 |
| 2010/0211847 A1* | 8/2010 | Livshitz et al. | 714/752 |
| 2011/0307755 A1* | 12/2011 | Livshitz et al. | 714/752 |

OTHER PUBLICATIONS

Lin, Shu et al, Constructions of Nonbinary Quasi-Cyclic LDPC Codes: A Finite Field Approach, 2006, http://ita.ucsd.edu/workshop/06/talks/papers/94.pdf.*

Xiangming Li et al., Good LDPC Codes Over GF(Q) for Bandwith Efficient Transmission; 2003 4th IEEE Workshop on Signal Processing Advances in Wireless Communications, Rome, Italy Jun. 15-18, 2003, pp. 95-99; ISBN: 0/7803-7858-X.

Cover Page of WO 207/112767 A1; dated Oct. 11, 2007 and International Search Report for corresponding PCT/EP2006/003789 Application.

(Continued)

*Primary Examiner* — M. Mujtaba K Chaudry
*Assistant Examiner* — Justin R Knapp
(74) *Attorney, Agent, or Firm* — Murphy & King, P.C.

(57) ABSTRACT

A parity check matrix construction method for constructing a non-binary parity check matrix defining a non-binary LDPC code. In particular, a parity check matrix construction method for setting codewords able to stably give a superior decoding performance is provided. For this reason, the non-binary non-zero elements are selected so that the determinants of the partial matrices corresponding to the cycles in the parity check matrix do not become 0. Due to this, a non-binary parity check matrix able to give large weight codewords is constructed.

19 Claims, 15 Drawing Sheets

OTHER PUBLICATIONS

Kimura D., Guilloud F. and Pyndiah R.: "Application of non-binary LDPC codes for small packet transmission in vehicle communications" Proc., The 5$^{th}$ International conference its Telecommunications, Brest, France, Jun. 2005, pp. 1-4 XP-002400074.

Wymeersch, H, et al.: "Log-domain decoding of LDPC codes over GF(q)" Proc., IEEE International Conference on Communications, Paris, France, Jun. 20, 2004,—pp. 772-776, XP010710426 ISBN: 0-7803-8533-0.

Xiao-Yu Hu et al.: "Binary representation of cycle tanner-graph GF (2<b>) codes" Proc., IEEE International Conference on Communications, Paris, France, Jun. 20, 2004, pp. 528-532, XP010710400 ISBN: 0-7803-8533-0 p. 531, left-hand column, paragraph 2—paragraph 3.

Matthew C. Davey, et al.: "Low-Density Parity Check codes over GF(q)" IEEE Communications Letters, IEEE Service Center, Piscataway, NJ, US, vol. 2, No. 6, Jun. 1998; XP011010585 ISSN: 1089-7798.

\* cited by examiner

FIG. 2

$$\text{PARITY CHECK MATRIX H} \times \text{CODEWORD C} = 0 \iff \det \text{DETERMINANT} = 0$$

FIG. 3

$$\text{PARITY CHECK MATRIX H} \times \text{CODEWORD C} \neq 0 \iff \det \text{DETERMINANT} \begin{vmatrix} A & C & 0 \\ B & 0 & E \\ 0 & D & F \end{vmatrix} \neq 0$$

FIG.7

|  | i=1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| j=1 | 1 | 0 | 0 | 0 | 0 | 1 | 0 | 0 | 1 | 0 | 0 | 0 | 0 | 0 | 0 | 1 |
| 2 | 0 | 1 | 0 | 0 | 0 | 0 | 1 | 0 | 1 | 1 | 0 | 0 | 0 | 0 | 0 | 0 |
| 3 | 0 | 0 | 1 | 0 | 0 | 0 | 0 | 1 | 0 | 1 | 1 | 0 | 0 | 0 | 0 | 0 |
| 4 | 1 | 0 | 0 | 1 | 0 | 0 | 0 | 0 | 0 | 0 | 1 | 1 | 0 | 0 | 0 | 0 |
| 5 | 0 | 1 | 0 | 0 | 1 | 0 | 0 | 0 | 0 | 0 | 0 | 1 | 1 | 0 | 0 | 0 |
| 6 | 0 | 0 | 1 | 0 | 0 | 1 | 0 | 0 | 0 | 0 | 0 | 0 | 1 | 1 | 0 | 0 |
| 7 | 0 | 0 | 0 | 1 | 0 | 0 | 1 | 0 | 0 | 0 | 0 | 0 | 0 | 1 | 1 | 0 |
| 8 | 0 | 0 | 0 | 0 | 1 | 0 | 0 | 1 | 0 | 0 | 0 | 0 | 0 | 0 | 1 | 1 |

FIG.8

|  | i=1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| j=1 | 3 | 0 | 0 | 0 | 0 | 5 | 0 | 0 | 1 | 0 | 0 | 0 | 0 | 0 | 0 | 5 |
| 2 | 0 | 3 | 0 | 0 | 0 | 0 | 1 | 0 | 5 | 2 | 0 | 0 | 0 | 0 | 0 | 0 |
| 3 | 0 | 0 | 2 | 0 | 0 | 0 | 0 | 6 | 0 | 2 | 7 | 0 | 0 | 0 | 0 | 0 |
| 4 | 4 | 0 | 0 | 4 | 0 | 0 | 0 | 0 | 0 | 0 | 4 | 6 | 0 | 0 | 0 | 0 |
| 5 | 0 | 5 | 0 | 0 | 4 | 0 | 0 | 0 | 0 | 0 | 0 | 5 | 3 | 0 | 0 | 0 |
| 6 | 0 | 0 | 2 | 0 | 0 | 3 | 0 | 0 | 0 | 0 | 0 | 0 | 2 | 3 | 0 | 0 |
| 7 | 0 | 0 | 0 | 6 | 0 | 0 | 7 | 0 | 0 | 0 | 0 | 0 | 0 | 5 | 1 | 0 |
| 8 | 0 | 0 | 0 | 0 | 6 | 0 | 0 | 1 | 0 | 0 | 0 | 0 | 0 | 0 | 3 | 7 |

FIG.13

$$H = \begin{Bmatrix} X - 0 - X & 0 & 0 \\ | & | & & & \\ X - X & 0 & X & 0 \\ & | & | & & \\ 0 & 0 & 0 & X & X \\ & | & | & & \\ 0 & X \underbrace{- X}_{CL} & 0 & X \end{Bmatrix}$$

CONSTRUCTION OF PARITY-CHECK MATRICES FOR NON-BINARYS LDPC CODES

TECHNICAL FIELD

The present invention relates to a parity check matrix construction method for constructing a non-binary parity check matrix defining a non-binary LDPC code, more particularly relates to a parity check matrix construction system and a transmitter and receiver utilizing that non-binary parity check matrix.

BACKGROUND ART

In recent years, in the same way as the conventional turbo codes, LDPC (low density parity check) codes have begun to come into attention as error correction codes having superior properties close to the Shannon limit.

In particular, it is known that the decoding performance of these LDPC codes is equivalent to that of said turbo codes or exhibits superior characteristics to turbo codes when the code lengths are longer. For example, when the code lengths are tens of thousands of bits or more, sometimes the decoding performance of the turbo codes currently employed in third generation mobile phone systems is exceeded.

As LDPC codes, at the present time, binary type LDPC codes and non-binary type LDPC codes are known. If using the latter non-binary LDPC codes, compared with when using the former binary LDPC codes, there is the defect that the amount of processing increases. However, while there is this defect, if using the non-binary LDPC codes, even if said code lengths become shorter, the decoding performance is expected to be improved compared with when using binary LDPC codes.

Therefore, if the above defect can be eliminated by future technical development, it can be expected that the range of application of non-binary LDPC codes will expand. Therefore, if considering the method of constructing non-binary parity check matrices defining such non-binary LDPC codes, there will be the following problems.

When constructing a binary parity check matrix defining a binary code, it is sufficient to just determine at what positions in the matrix (what row and what column) to arrange the elements 1, that is, the non-zero elements, in a matrix comprised of the elements 0 and elements 1.

However, when constructing a non-binary parity check matrix defining the non-binary code, it is not sufficient to just determine the positions of said non-zero elements. It is necessary to also determine the values of the non-binary elements constituted by the n-ary elements (1, 2, 3, 4 . . . )

If studying the method for determining the values of the n-ary elements, in the past, there has been no clear standard or rule for the method of determination. In actuality, the general practice has been to randomly select the values of the n-ary elements (random selection method). For this reason, there was the problem that the performance ended up fluctuating in accordance with the selected pattern and stable, good performance could not be obtained.

DISCLOSURE OF THE INVENTION

Therefore, an object of the present invention, in consideration of said problem, is to provide a method of construction of an algorithm for constructing non-binary parity check matrices which give much better and stable performance compared with the case by the conventional random selection.

Further, an object of the invention is to provide a system for construction of said non-binary parity check matrices and further to provide a transmitter and receiver utilizing said non-binary parity check matrices.

To achieve said objects, the present invention is characterized by (1) setting a binary parity check matrix of a binary LDPC code, (2) detecting the cycles included in the binary parity check matrix, and (3) selecting the non-binary elements in partial matrices corresponding to the detected cycles so that the determinants of the partial matrices do not become 0, that selected non-binary elements forming the non-zero elements in the non-binary parity check matrix.

BRIEF DESCRIPTION OF THE DRAWINGS

FIG. 2 is a view of the relationship between cycles and codewords for facilitating understanding of the present invention, FIG. 3 is a view of the relationship between cycles and codewords in the present invention, FIG. 7 is a view of an example of a binary parity check matrix used for the explanation of FIG. 5 and FIG. 6, FIG. 8 is a view of an example of a non-binary parity check matrix perfected by the present invention used for the explanation of FIG. 5 and FIG. 6, FIG. 13 is a view for explaining the grounds of the formula for calculation of the upper limit length (part 1)

MODE OF WORKING THE PRESENT INVENTION

Figure 1:
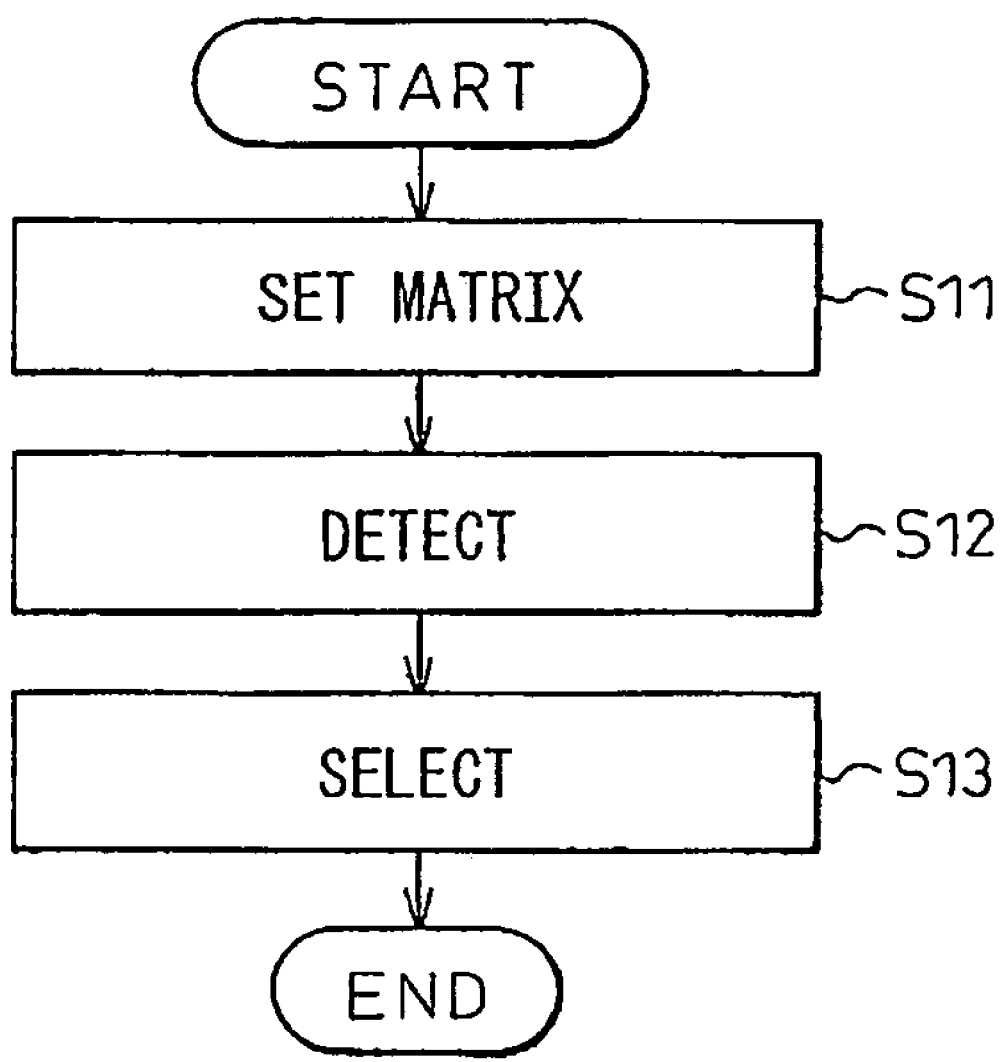
FIG. 1 is a flow chart of the basic steps of a parity check matrix construction method according to the present invention.

FIG. 1 is a flow chart of the basic steps in the parity check matrix construction method according to the present invention.

In the figure,

S11: matrix setting step

S12: detection step

S13: selection step.

At step S11, a binary parity check matrix of a binary LDPC code having the same configuration as a non-binary parity check matrix is set, at step S12, the cycles included in the set binary parity check matrix are detected, at step S13, the non-binary elements in partial matrices corresponding to the cycles detected in the non-binary parity check matrix are selected so that the determinants for the partial matrices do not become zero, where, said selected non-binary elements form the non-zero elements in the non-binary parity check matrix.

The thus selected non-binary elements form the non-zero elements in the non-binary parity check matrix. This means that small cycles where the determinants of the corresponding partial matrices become zero are prevented from being included in the non-binary parity check matrix. That is, the non-zero elements in the non-binary parity check matrix are selected so that there are no small weight (few non-zero element) codewords. The reason why to do so is that, as is well known, a parity check matrix gives a better decoding performance the smaller the number of small weight codewords, that is, small non-zero element codewords, included.

Here, to facilitate understanding of the present invention, the background of the art relating to the present invention will be explained.

An LDPC code of a code rate R and a code length N is defined by an M row and N column parity check matrix H as a linear block code. This LDPC code is called a non-binary LDPC code when the parity check matrix H is comprised of elements of a non-binary Galois field.

Here, a Galois field with q number of elements is expressed as GF(q). In the non-binary case, q>2. In particular, q of a power of 2 is generally used. For differentiation, an LDPC code of q=2 is called a "binary LDPC code". Using this parity check matrix H, the LDPC code is defined as Hc=0. Here, c is the N row 1 column codeword vector. That is, the any vector c satisfying the above equation Hc=0 is defined as a codeword of the LDPC code defined by a parity check matrix H. The parity check matrix of this LDPC code is characterized in that the density of the non-zero elements is small.

Figure 11:
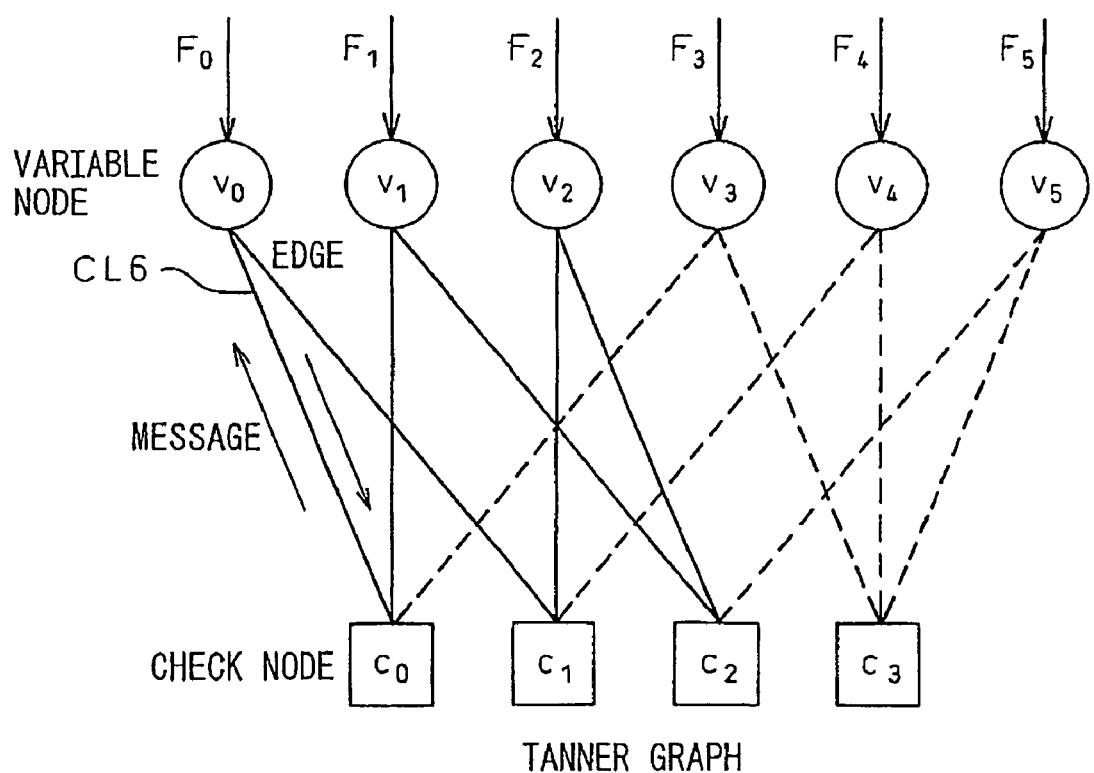
FIG. 11 is a view linking a known Tanner graph with a parity check matrix of FIG. 2.

Note that the LDPC code is decoded on a Tanner graph corresponding to the parity check matrix H (see later mentioned FIG. 11). This Tanner graph is comprised of N number of variable nodes, M number of check nodes, and WcN=WrM number of edges. These correspond to the columns, rows, and non-zero elements respectively in a parity check matrix. Wc indicates the column weight (number of non-zero elements in one column), while Wr indicates the row weight (number of non-zero elements in one row). Note that here, for simplification, consider the case that the column weight and row weight are constant (regular LDPC code).

For the decoding, a BP (belief propagation) algorithm on said Tanner graph is used. This is a type of repeated decoding. By exchanging information (messages) between the variable nodes and check nodes, the likelihood of the bits is converged to the optimal value. The reception performance of the LDPC code depends to a large degree on this Tanner graph, that is, the parity check matrix H, so many systems have been devised to construct good parity check matrices. Specifically, it is known that elimination of small cycles in the parity check matrix greatly improves the performance. Almost all parity check matrix construction systems focus on elimination of short length cycles. Note that in the Tanner graph of the later explained FIG. 11, an example of a cycle CL6 of a length 6 is shown by the solid line.

The present invention, as explained above, does not aim at elimination of small cycles in a parity check. Its object is to select values of the non-zero elements in accordance with a certain set algorithm (the above FIG. 1) so as to eliminate small weight codewords corresponding to small cycles and thereby construct parity check matrices giving a good decoding performance. According to the algorithm unique to the present invention, compared with the above conventional "random selection method", a superior decoding performance is stably obtained (see the later explained FIG. 4).

Below, embodiments of the present invention will be explained. The present invention takes note of a non-binary LDPC code using a parity check matrix of the column weight 2. In general, in a regular binary LDPC code, it is reported that the decoding performance by a parity check matrix of the column weight 3 is good. However, in a regular non-binary LDPC code, as the Galois field increases in dimensions, usually with q=8 or so, the decoding performance of a parity check matrix with a column weight 2 exceeds that of the column weight 3. For this reason, even if limiting the embodiment of the present invention to a parity check matrix of the column weight 2, there is not that much of a problem. Note that even if considering the optimal distribution of the irregular column weight, as q becomes larger, it is shown that the optimal column weight distribution approaches a regular weight 2 (see following document).

[Document]

X. Y. Hu, E. Eleftheriou, and D. M. Arnold, "Regular and Irregular Progressive Edge-Growth Tanner Graphs," IEEE Trans. Inform. Theory, vol. 51, pp. 386-398, January 2005.

Next, refer to FIG. 2. FIG. 2 is a view of the relationship of the cycles and codewords for facilitating understanding of the present invention. In the figure, the right side of the double-headed arrow shows the relationship of the above Hc=0. The "H" of Hc is the parity check matrix, i.e., a matrix comprised of M rows and N columns. How to determine the non-zero elements (A, B, C . . . ) in this matrix is the challenge of the present invention.

The "c" of said Hc means codeword. That is, this is a codeword linked one-to-one with each of the many "information bits" to be encoded and transmitted from the transmitting side. As shown in FIG. 2, when Hc=0 stands, c is a codeword. Further, in this case, corresponding to the cycle CL (in the figure, the example of a cycle of length=6 is shown), the non-zero elements a, b, and c in the codeword are unambiguously determined. That is, $Aa + Cb = 0$ $Bb + Ec = 0$ $Db + Fc = 0$, so the a, b, and c forming the non-zero elements of the codeword c are determined (note: the codeword c differs from the non-zero element c).

Therefore, when Hc=0 stands, there is the codeword c. In this case, so long as the determinant of the partial matrix corresponding to the cycle CL, that is, det| |, is 0, Hc=0 could stand with non-zero vector c. The relationship of the two is shown by the double-headed arrow of FIG. 2.

However, in FIG. 2, the non-zero elements of the matrix are expressed in a non-binary manner such as A, B, C . . . . This is because the present invention covers a non-binary parity check matrix. In the case of a binary parity check matrix, said A, B, C . . . are 1.

What is to be noted here is that in a binary matrix comprised of elements 0 and elements 1, the determinant, that is, the det| | at the right side of FIG. 2, always becomes 0. This being so, there are no elements preventing the determinant from becoming zero explained at step S13 of FIG. 1.

However, in a non-binary matrix, as shown in FIG. 3, it is possible to select non-binary non-zero elements (A, B, C . . . ) satisfying det| |≠0. This is the point of the present invention.

In short, the parity check matrix configuration algorithm in the present invention takes note of the fact that in a parity check matrix H of the column weight 2, the matrix H comprised of the cycle CL corresponds to the codeword c and there is a corresponding codeword only when the determinant of the matrix is zero, finds cycles in the parity check matrix, and selects the non-binary non-zero elements so that the determinant does not become 0. Due to this, it becomes possible to increase the smallest code weight of the codeword c and improve the existing decoding performance (reception performance).

Figure 4:
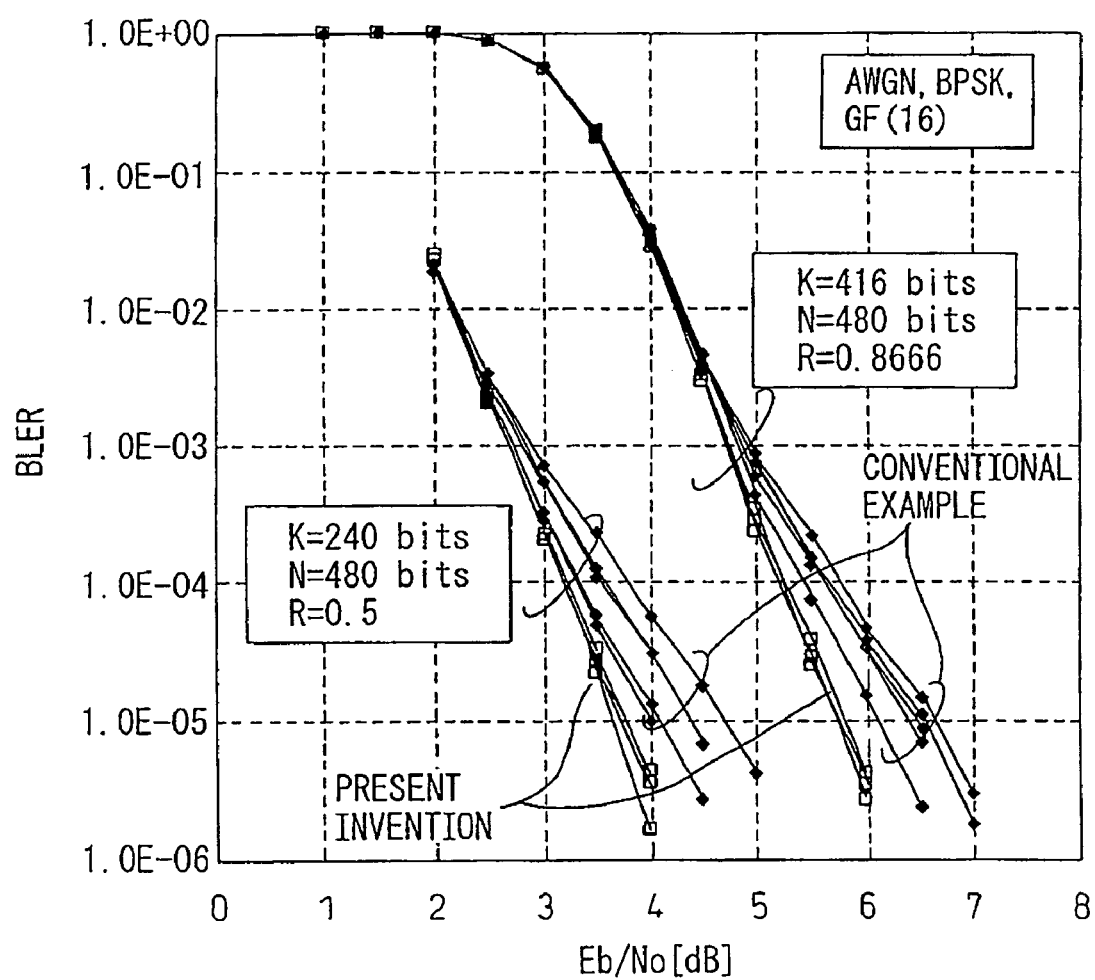
FIG. 4 is a view of the results of comparison of the decoding performance between the present invention and the prior art.

FIG. 4 is a view showing the results of comparison between the present invention and the prior art. That is, it is a view of an example of the results of simulation for clarifying the superior effects of the present invention.

In the graph of FIG. 4, the ordinate indicates the "block error rate" (BLER) and the abscissa indicates the "signal-to-noise power density ratio per bit" (Eb/No) [dB]. Further, at the top right of the graph, the conditions of the simulation for obtaining the results of comparison are shown. That is, it is simulation using additive white Gaussian noise (AWGN), BPSK modulation, and GF(16), that is, 1 to 15 as the non-binary elements.

Here, compared with the existing conventional example (random selection method), according to the present invention, at the block error rate (BLER) being ten to the minus fifth, it is learned that an improvement of the reception performance of about 0.1 to 1.0 dB is achieved. In addition to this, when employing a non-binary parity check matrix constructed using the prior art, the reception performance fluctuates. However, when employing a non-binary parity check matrix constructed according to the present invention, it is learned that the reception performance, that is, the decoding performance, becomes extremely stable without fluctuation.

Note that K (=N−M) shown in FIG. 4 indicates the number of the information bits to be encoded and transmitted, N indicates the number of bits after encoding, and R (=K/N) indicates the code rate.

Figure 5:
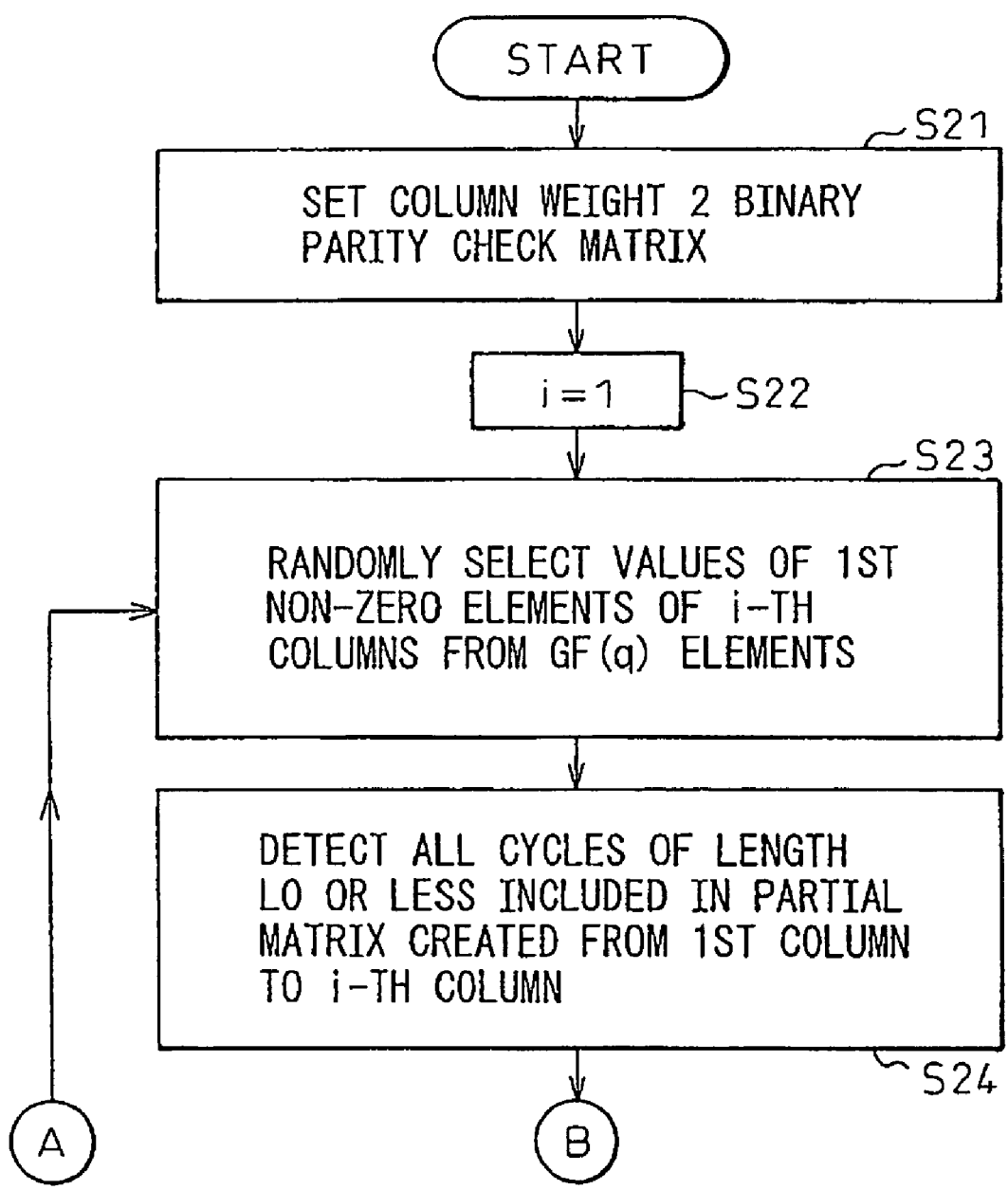
FIG. 5 is a flow chart showing a specific example of a parity check matrix construction method according to the present invention (part 1)
Figure 6:
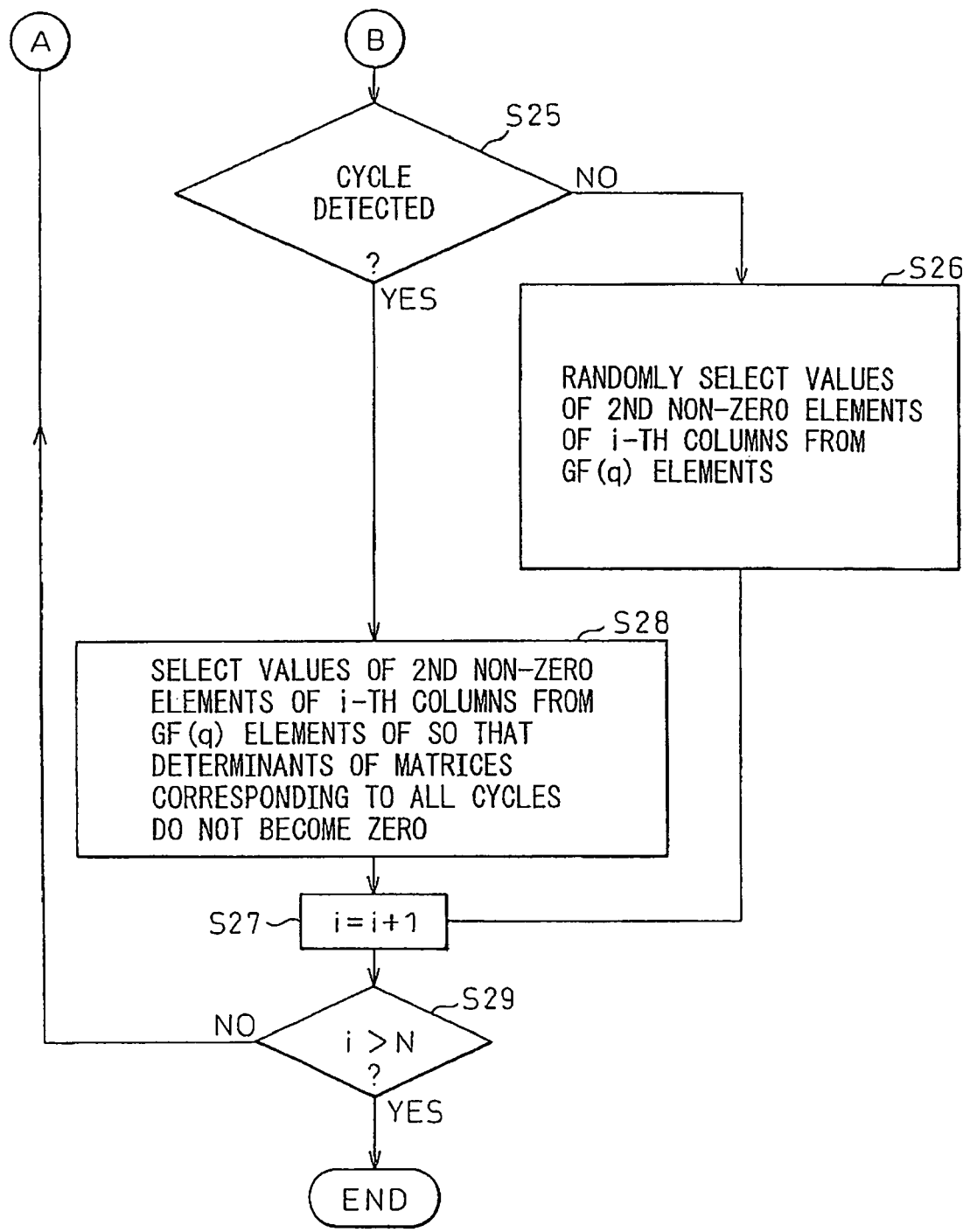
FIG. 6 is a flow chart showing a specific example of a parity check matrix construction method according to the present invention (part 2)

Next, the method of construction of a parity check matrix based on an embodiment of the present invention will be explained specifically. FIG. 5 is a flow chart showing the method of construction of a parity check matrix based on the present invention (part 1), while FIG. 6 is the same flow chart (part 2). Further, FIG. 7 is a view of an example of a binary parity check matrix used for explanation of FIG. 5 and FIG. 6, while FIG. 8 is a view of an example of a non-binary parity check matrix perfected by the present invention used for explanation of FIG. 5 and FIG. 6.

Referring to FIG. 5 and FIG. 6, the steps of the flow chart are basically comprised of the three basic steps shown in FIG. 1, that is, the "matrix setting step" S11, the "detection step" S12, and the "selection step" S13, but are specifically further comprised of various steps. These are as follows:

At step S21 (FIG. 5), a binary parity check matrix with a column weight (number of non-zero elements contained in each column (in the binary case, 1)) of 2 is set. An example is shown in FIG. 7. In this matrix setting step (S11, S21), said binary parity check matrix can be selected and set from a plurality of known binary parity check matrices constructed by a known algorithm. For example, there are the matrices described in the above document etc.

At step S22, the i-th column in the N columns in the matrix of FIG. 7 is noted. First, i=1, that is, the 1st column, is noted.

At step S23, the value of the non-zero element "1" of the 1st column and 1st row (i=1) in FIG. 7 is selected at random, that is, arbitrarily, from the GF(q) elements. Arbitrary selection is used because the later explained cycle has not yet been detected. In the example of FIG. 8, q=8 and GF(8), so one value among 1 to 7 is selected completely arbitrarily. According to the example of FIG. 8, "3" is selected as the i=1, j=1 element. After this, steps S23->S29->S23 are repeated several times.

At step S24, all cycles of the length $L_0$ (explained later) or less included in the partial matrices created from the 1st column to the i-th column, that is, the partial matrices created at the left from the i-th column in question are detected (the cycles at the right from the i-th column are not noted at all).

Regarding detection of the cycles, for example, referring to the above-mentioned FIG. 2, at said detection step, loops comprised of pluralities of non-zero elements successively connected along the row direction and column direction in a non-binary parity check matrix comprised of elements A, B, C . . . are detected as cycles. At this step S24, the cycles in the binary parity check matrix of FIG. 7 are detected, so in this case, loops comprised of pluralities of elements 1 successively connected along the row direction and column direction in a binary parity check matrix comprised of elements 0 and elements 1 are detected as cycles.

Not just one loop forming such a cycle is detected in one matrix. Usually, a plurality of cycles is detected. The length of a cycle means, for example, if referring to FIG. 2, 6 for the length of the cycle CL. That is, the total of the line segments AB, BE, EF, FD, DC, and CA forming the cycle CL is 6.

The values of the non-zero elements are selected so that the determinant does not become zero for each such detected cycle, but there are cases where the determinants will not become zero for all detected cycles. In this case, said lengths end up being limited to not more than a predetermined upper limit length. This is because it is sufficient that a certain size of codeword be obtained. Note that it is also possible to detect only cycles of less than the upper limit length from the start to realize greater efficiency of the routine.

Further, if expressing this quantitatively, the length $L_0$ of the cycle is made that upper limit value. Further, this upper limit length is determined by $$L_{min}+2[(L_{min}-2)/4]$$

Here, $L_{min}$ indicates the length of the shortest cycle included in the binary parity check matrix, while [ ] indicates that, when expressing X as [X], that this [X] is a highest integer not exceeding X. Note that the grounds for deriving the formula of the upper limit value are explained in detail with reference to FIG. 13 to FIG. 16 at the tail end of this description.

Above, the detection of cycles was explained in detail, but at step S25 (FIG. 6), whether or not said cycles were actually detected is judged.

Step S26: When it is judged that no cycles were detected at step 25 (No), the value of the second non-zero element (taking as an example the i=1 of FIG. 7, the element 1 positioned at i=1 and j=4) corresponding to the column weight 2 of the i-th column is selected at random from the elements (1 to 7) of GF(q) (since the matrix of FIG. 8 is covered, q=8). Since this is random, any value may be selected completely arbitrarily.

It is possible to completely randomly select all elements in the middle of one cycle in this way because so long as suitably selecting the single last unselected element in the later explained step S28, it is possible to make the determinant of the partial matrix corresponding to said cycle non-zero.

In short, at said step S26, the selection at the selection step S13 (FIG. 1) is performed so as to assign one of the non-binary elements constituted by the n-ary elements (1 to 7) to each element 1 in the elements forming the cycles in the binary parity check matrix of FIG. 7 comprised of the elements 0 and elements 1. In this case, one of said n-ary elements is randomly assigned to each element 1 up to the single last remaining unselected element 1.

Returning to said step S25, here, if cycles are detected (YES), the routine proceeds to step S28.

At step S28, the value of the second non-zero element of the i-th column is selected from the GF(q) elements (1 to 7) so that the determinants of the matrices corresponding to all cycles do not become zero.

In short, the above selection (S13) is executed by successively assigning one of said n-ary elements (1 to 7) to the elements 1 in the matrix of FIG. 7. Only when assigning one of the n-ary elements (1 to 7) to the last remaining unselected element 1, one of the n-ary elements is selected so that the determinant det| | of the partial matrix corresponding to said cycle CL does not become zero. Note that when it is not possible to make all of the determinants of the matrix non-zero, priority is given to the small matrices corresponding to small cycles.

After this selection, the routine proceeds to step S27. After the end of step S26 as well, the routine proceeds to step S27.

Step S27: After determining the non-binary non-zero elements shown in FIG. 8 for the elements 1 at the i-th column of FIG. 7 at step S26 or S28; the next (i+1) column is noted.

At step S29, so long as i>N (in FIG. 7, N=16) is not true, the routine returns to step S23 whereupon the same operation is repeated.

The above explanation of the operation was made assuming the case where both the binary parity check matrix (FIG. 7) and non-binary parity check matrix (FIG. 8) are matrices of the column weight 2 as a good example, but even when not all of the column weight is 2 (only part has column weight 2), by applying the present invention to only the columns with the column weight 2, when the ratio of the columns with column weights of not 2 is small, a certain effect can be expected.

Above, the method of construction of a parity check matrix based on the present invention was explained in detail, but the idea of the present invention can also be realized as a parity check matrix construction system. One example will be shown below.

Figure 9:
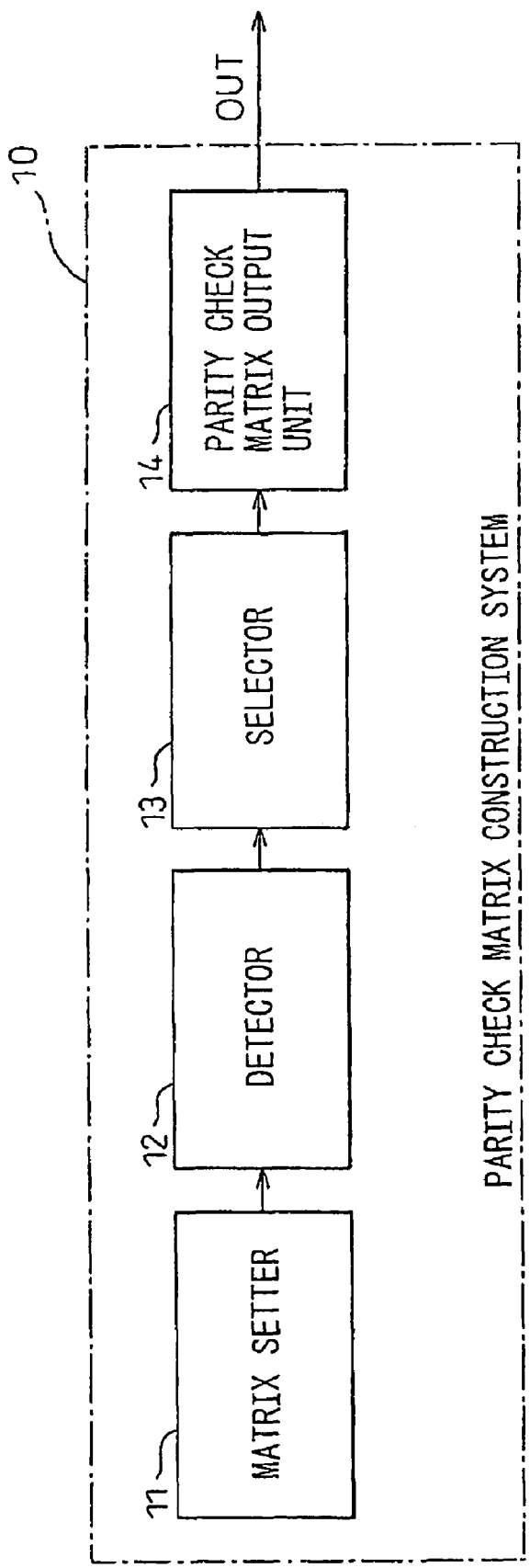
FIG. 9 is a view of a parity check matrix construction system according to the present invention.

FIG. 9 is a view of a parity check matrix construction system according to the present invention. As shown in this figure, the parity check matrix construction system 10 is comprised of a matrix setter 11, detector 12, selector 13, and parity check matrix output unit 14. The functions of the parts (11 to 13) were as explained in FIG. 1 and FIG. 5 and FIG. 6.

This parity check matrix construction system 10 is a parity check matrix construction system for constructing a non-binary parity check matrix defining a non-binary LDPC code. Here, the matrix setter 11 sets a binary parity check matrix of a binary LDPC code (FIG. 7) having the same configuration as a non-binary parity check matrix (FIG. 8). The detector 12 detects cycles CL included in said set binary parity check matrix. The selector 13 selects the non-binary elements in the partial matrices corresponding to the detected cycles in said non-binary parity check matrix so that the determinants det| | for the partial matrices do not become 0.

Further, the parity check matrix output unit 14 determines the non-zero elements (1 to 7) in the non-binary parity check matrices by said selected non-binary elements and outputs the non-binary parity check matrix.

The above explained parity check matrix construction method (FIG. 1) or parity check matrix construction system (FIG. 9) according to the present invention can be effectively utilized for communication of information between a transmitting apparatus and a receiving apparatus. Most preferably, it can be utilized for communication of information in a wireless communication system comprised of a wireless transmitter and a wireless receiver. Therefore, these wireless transmitter and receiver will be explained below.

Figure 10:
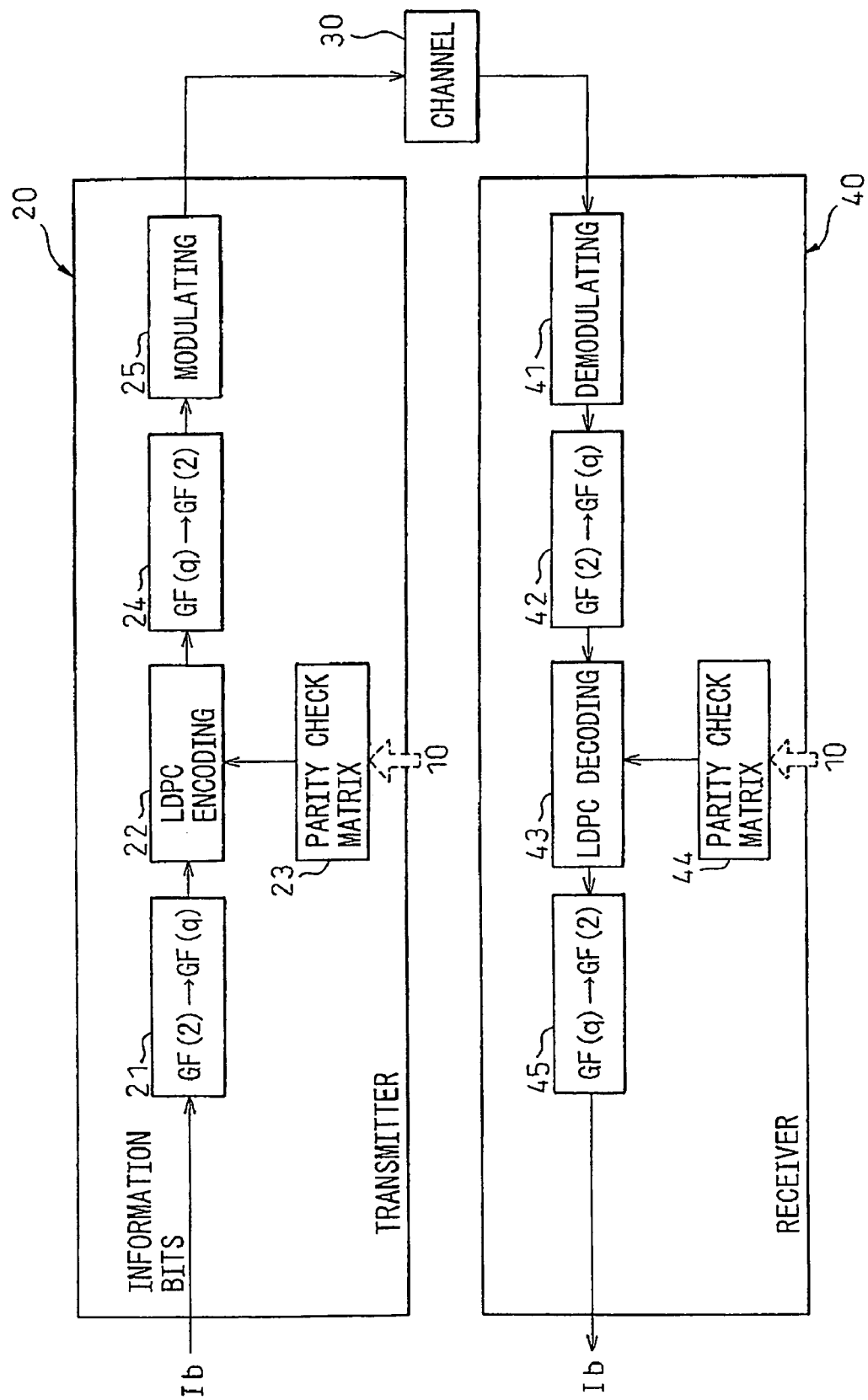
FIG. 10 is a view of a wireless communication system utilizing a parity check matrix according to the present invention.

FIG. 10 is a view of a wireless communication system utilizing a parity check matrix according to the present invention. The top part shows a transmitter 20, while the bottom part shows a receiver 40. The two (20, 40) are connected through a wireless channel 30.

First, looking at the transmitter 20, this transmitter 20 is a transmitter including an LDPC encoder 22 which receives as input information bits Ib to be encoded and transmitted and encodes these by a non-binary LDPC code, a encoding side parity check matrix holder 23 which holds a non-binary parity check matrix used at the time of this coding, and a modulator 25 which modulates the encoded information bits Ib from the LDPC encoder 22 and transmits them to the reception side.

The point to note here is that the encoding side parity check matrix holder 23 holds the non-binary parity check matrix which is identical to the one used at transmitter side.

This transmitter 20 is further provided with an input side converter 21 provided at the input side of the LDPC encoder 22 for converting the binary data constituted by the information bits Ib to non-binary n-ary symbols and an output side converter 24 provided at the output side of the LDPC encoder 22 for converting the information bits comprised of the non-binary n-ary symbols encoded by the LDPC encoder 22 to binary data.

Said input side converter 21 makes the LDPC encoder 22 operating by the n-ary elements match with the binary information bits Ib, taking as an example the case of GF(4), by performing the conversion to n-ary elements of

00->0
1->1
10->2
11->3

(GF(2)->GF(4)), while said output side converter 24 makes the output of the n-ary elements from the LDPC encoder 22 operate on a binary basis, similarly taking as an example the case of GF(4), by performing the binary conversion of

0->00
1->01
2->10
3->11

(GF(4)->GF(2)).

Looking at the receiver 40 shown at the bottom part of FIG. 10, this is a receiver including a demodulator 41 which receives a signal encoded (22) by a non-binary LDPC code, modulated (25), and transmitted from the transmitting side (20) and demodulates it, an LDPC decoder 43 which decodes the demodulated bits expressed by likelihood from this demodulator 41 by a non-binary LDPC code, and a decoding side parity check matrix holder 44 which holds the non-binary parity check matrix used when performing this decoding.

The point to note here is that the decoding side parity check matrix holder 44 holds the non-binary parity check matrix constructed by the parity check matrix construction system 10 (FIG. 9) based on the present invention. That is, in the same way as explained above, this parity check matrix construction system 10 is comprised of (i) a matrix setter 11, (ii) detector 12, (iii) selector 13, and (iv) parity check matrix output unit 14.

This receiver 40 is further provided with an input side converter 42 provided at the input side of the LDPC decoder 43 for converting the binary demodulated bits expressed with likelihood from the demodulator 41 to non-binary n-ary symbols and an output side converter 45 provided at the output side of the LDPC decoder 43 for converting the information bits Ib comprised of the non-binary n-ary symbols decoded by the LDPC decoder 43 to binary data. That is, this output side converter 45 performs the conversions:

0->00
1->01
2->10
3->11

(GF(4)->GF(2)).

On the other hand, said input side converter 42 is suitably called a likelihood converter from its functions. This groups the binary likelihood obtained from the demodulator 41 for every q bits and converts each to one symbol non-binary likelihood. As an example, the conversion GF(2)->GF(4) becomes:

$Q_0 = P_{00} P_{10}$
$Q_0 = P_{00} P_{11}$
$Q_2 = P_{01} P_{10}$
$Q_3 = P_{01} P_{11}$.

Here, $P_{10}$ is the probability of the first bit before conversion being 0, while $Q_0$ expresses the probability of the symbol after conversion being 0. The thus obtained symbol likelihood is input to the decoder 43.

In this decoder 43, the already explained Tanner graph is used for decoding the LDPC code. FIG. 11 is a view showing a known Tanner graph corresponding to the parity check matrix of FIG. 2. In the figure, $V_0, V_1, \ldots V_5$ are so-called "variable nodes", while $C_0, C_1 \ldots C_3$ are so-called "check nodes". $F_0, F_1 \ldots F_5$ input to the variable nodes are the results of demodulation from the demodulator 41 of FIG. 10 through the above-mentioned likelihood converter (42). The bold line CL6 in the figure corresponds to the cycle CL shown in FIG. 2. The length is 6.

Next, a modification of the transmitter 20 shown in FIG. 10 will be explained. This modification efficiently utilizes the advantages of a non-binary LDPC code and the advantages of a binary LDPC code. That is, the code length becomes relatively long like with the information bits Ib. When comparing the case of use of the non-binary LDPC code for this purpose and the case of using a binary LDPC code and the degree of improvement of the reception performance by use of the non-binary LDPC code is low, the encoding is performed by a binary LDPC code without use of a non-binary LDPC code.

On the other hand, the non-binary LDPC code is used for information of a short code length where high quality ($Q_0S$) communication is required such as control information or broadcast information in a cellular network. If illustrating the above idea, the result becomes FIG. 12.

Figure 12:
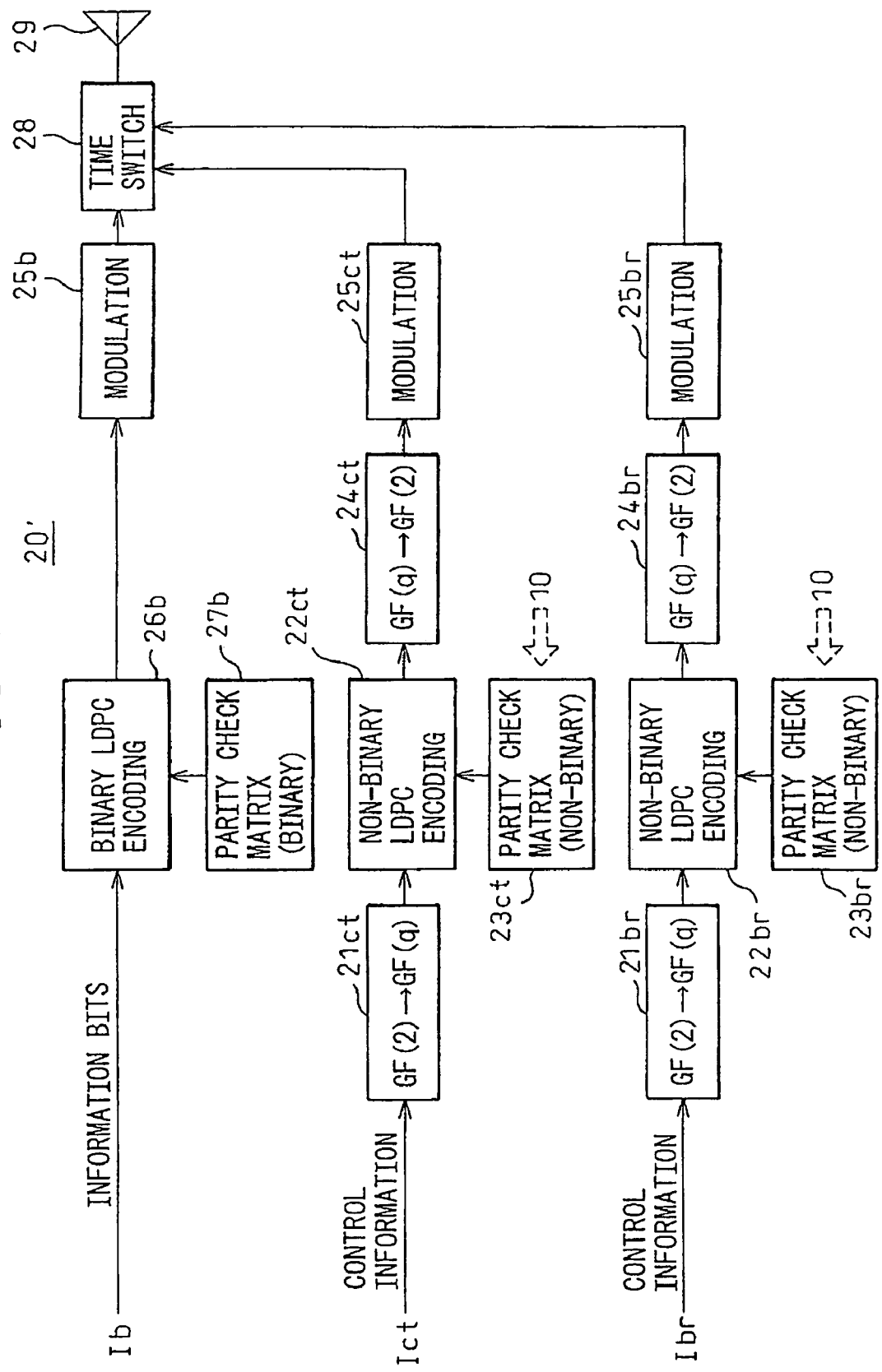
FIG. 12 is a view of a transmitter utilizing a parity check matrix according to the present invention.

FIG. 12 is a view of a wireless transmitter 20' utilizing the parity check matrix according to the present invention. Note that elements similar to the elements shown in FIG. 10 are shown with the same reference numerals or symbols attached.

Expressing this overall, this transmitter 20' is a transmitter where the transmission information to be encoded and transmitted includes first transmission information of a long code length (for example, Ib) and second information of a shorter code length than said first transmission information and requiring a higher quality than said first information (for example Ict or Ibr). This transmitter 20' is provided with a binary LDPC encoder 26b which receives as input first transmission information (Ib) and encodes this by a binary LDPC code, non-binary LDPC encoders (22ct, 22br) which receive as input second transmission information (Ict, Ibr) and encode these by a non-binary LDPC code, a first modulator 25b which modulates the encoded output from the binary LDPC encoder 26b, second modulators (25ct, 25br) which modulate the encoded outputs from the non-binary LDPC encoder (22ct, 22br), and a transmitting mean (28, 29) which combines the modulated outputs from these first and second modulators and transmits the result to the reception side.

Here, the non-binary LDPC encoders (22ct, 22br) perform the above encoding by the non-binary parity check matrix constructed by the parity check matrix construction system 10 (FIG. 9). Further, the parity check matrix construction system, as already explained, is comprised of (i) a matrix setter 11, (ii) detector 12, (iii) selector 13, and (iv) parity check matrix output unit 14.

Specifically, the binary LDPC encoder 26b receives as input the information bits Ib in wireless communication as said first transmission information, while the non-binary LDPC encoder 22ct receives as input control information Ict in wireless communication as said second transmission information.

Further, the binary LDPC encoder 26b receives as input the information bits Ib in wireless communication as said first transmission information, while the non-binary LDPC encoder 22br receives as input the broadcast information Ibr in wireless communication as said second transmission information.

Still further, the system is provided with input side converters (21ct, 21br) provided at the input sides of the LDPC encoders (22ct, 22br) for converting binary data constituted by second transmission information (Ict, Ibr) to non-binary n-ary symbols and output side converters (24ct, 24br) provided at the output sides of LDPC encoders (22ct, 22br) for converting second transmission information (Ict, Ibr) comprised of non-binary n-ary symbols encoded by the LDPC encoders (22ct, 22br) to binary data.

The above transmitting means (28, 29) is comprised of a time switch 28 and transmission antenna 29, the coding information transmitted from this transmission antenna 29 is transmitted to the receiver (corresponding to 40 in FIG. 10), this receiver receives said first transmission information (Ib) and second transmission information (Ict, Ibr), and the information separated at the time switch is individually reproduced by the corresponding decoder (corresponding to 43 in FIG. 10).

Finally, the grounds by which the above upper limit length is derived by $$L_{min} + 2[(L_{min}-2)/4]$$

will be explained in detail.

Figure 14:
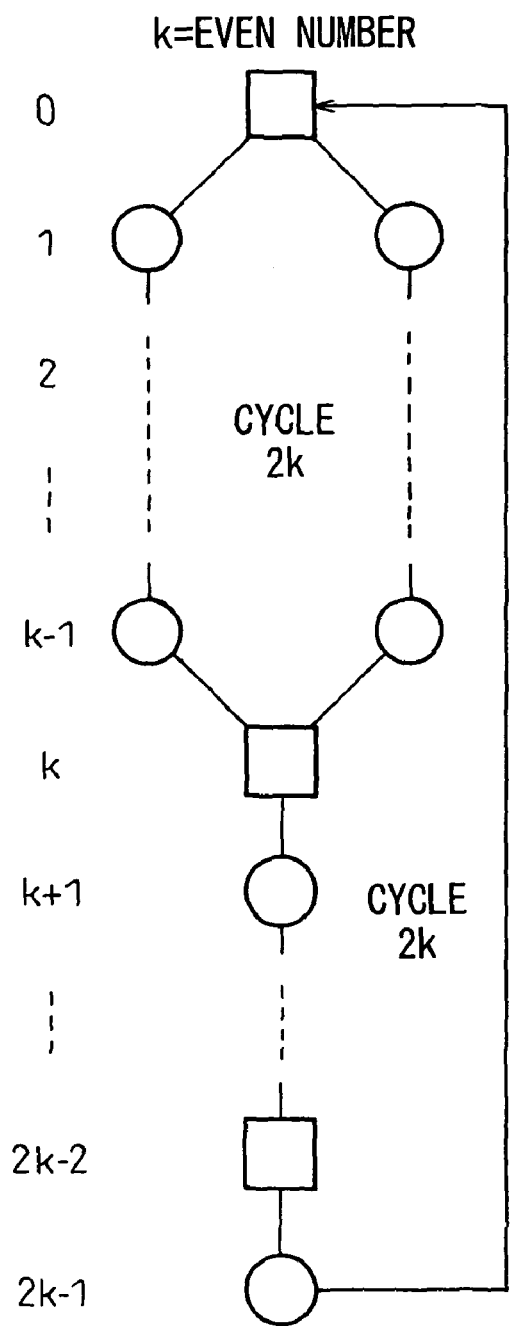
FIG. 14 is a view for explaining the grounds of the formula for calculation of the upper limit length (part 2)
Figure 15:
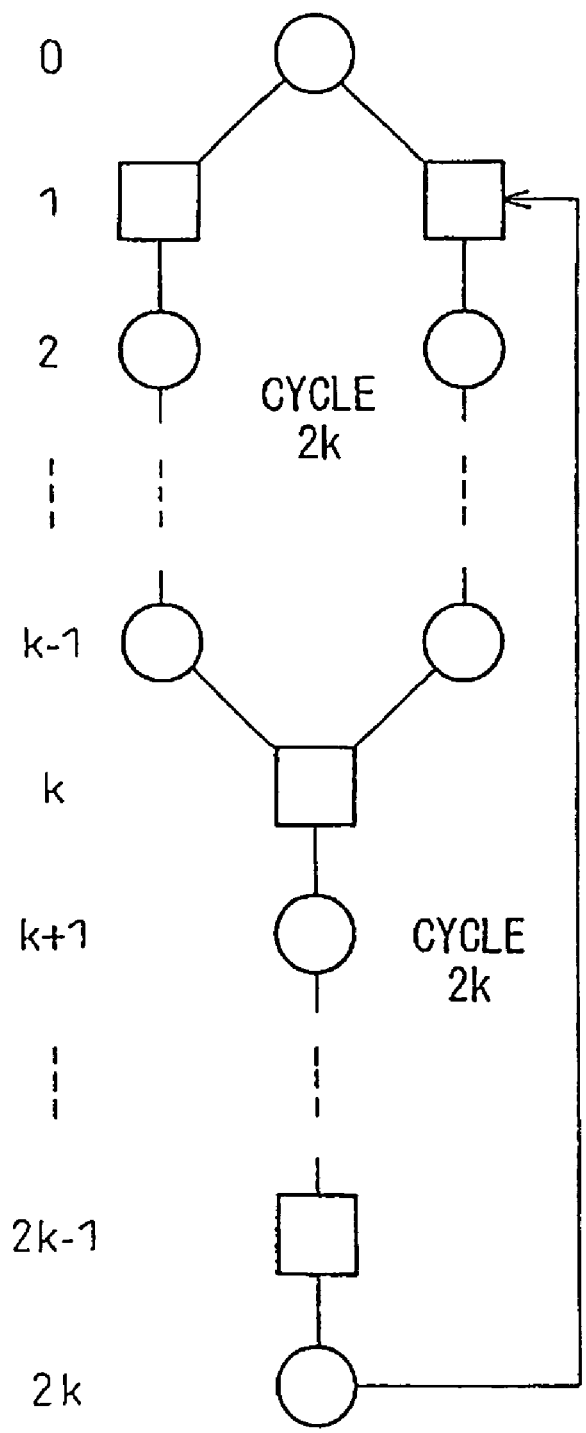
FIG. 15 is a view for explaining the grounds of the formula for calculation of the upper limit length (part 3)
Figure 16:
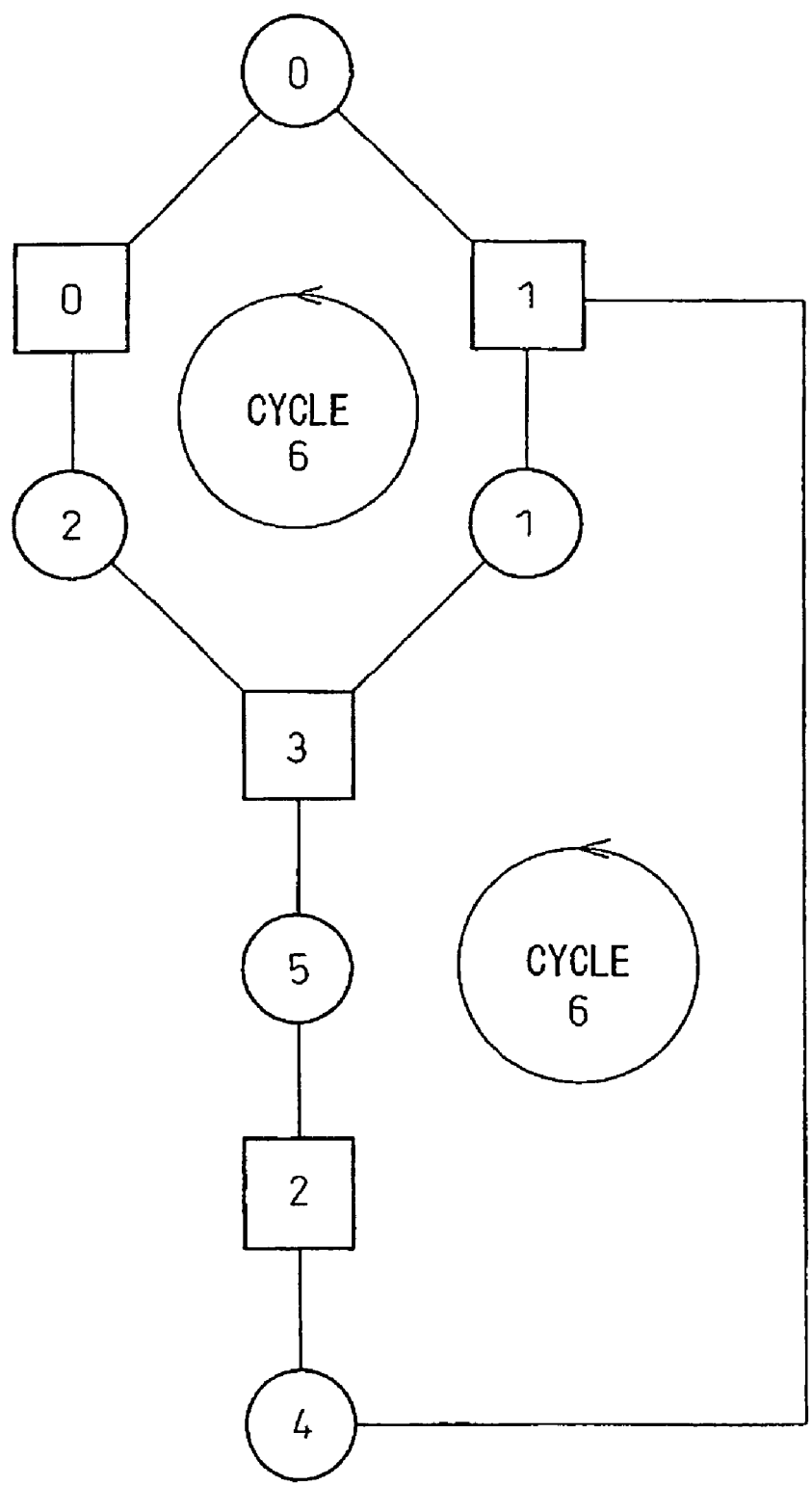
FIG. 16 is a view for explaining the grounds of the formula for calculation of the upper limit length (part 4).

FIG. 13 is a view for explaining the grounds of the formula for calculation of the upper limit length (part 1), FIG. 14 is the same view (part 2), FIG. 15 is the same view (part 3), and FIG. 16 is the same view (part 4). The explanation will be given while referring to these drawings.

Consider a regular LDPC code with a column weight of 2. As explained above, a cycle where the determinant of the corresponding partial matrix is 0 has a corresponding codeword. However, not all of the codewords correspond to cycles. Codewords are classified into two types: codewords corresponding to cycles (cycle codewords) and codewords not corresponding to cycles (non-cycle codewords). For example, the (partial) parity check matrix H shown in FIG. 13 has a corresponding (non-cycle) codeword. That is, there is a vector c giving Hc=0. In general, when the weight of all of the rows of a parity check matrix is 2 or more and N>M, there is always a corresponding codeword. This type of parity check matrix always includes cycles inside it. In FIG. 13, the cycle CL included inside is shown.

The present invention was explained above with reference to the provision of an algorithm selecting the elements of the parity check matrix of the non-binary LDPC code so that there are no codewords with small weight corresponding to short length cycles. Even if applying this algorithm to cycles of a certain length or more, if there are non-cycle codewords of less weight, there is no longer any merit to application of this.

Therefore, it is learned that the maximum weight of the cycle codewords avoided by application of the algorithm of the present invention may be one smaller than the smallest weight of the non-cycle codewords. To find the smallest weight of the non-cycle codewords, the fact that in a regular LDPC code with a column weight of 2, the partial parity check matrices corresponding to the codewords always include cycles inside is utilized. Further, to facilitate understanding of the problem, the charts such as FIG. 14 and FIG. 15 are utilized. In FIG. 14 and FIG. 15, the circles show the variable nodes, while the squares show the check nodes.

First, a chart corresponding to the cycle of the shortest length ($L_{min}$=2k) is prepared (corresponding to top halves of FIG. 14 and FIG. 15). After this, as shown in these figures, a larger chart is prepared by enlarging the chart in the order of the variable node->check node from the check node positioned at the bottom of the cycle. In this chart, the smallest chart prepared so that there is no cycle smaller than the shortest length of the cycles and so that the number of edges connecting to all of the variable nodes and check nodes becomes 2 or more becomes the chart corresponding to the partial parity check matrix corresponding to the smallest non-cycle codeword. For example, the chart corresponding to the parity check matrix H of FIG. 13 becomes as shown in FIG. 16. The number of variable nodes included in this chart (=number of columns of parity check matrix) becomes 5. That is, it is learned that the smallest weight of the non-cycle codewords becomes 5.

Therefore, in this case, the algorithm of the present invention should be applied to cycles shorter than a cycle corresponding to a codeword of the weight 5 (length 10). That is, the maximum length of the cycles considered becomes 8. Generalizing this, as shown in FIG. 16, by assuming that $L_{min}$=2k and considering the case where k is an even number and odd number separately, the number of variable nodes becomes 3k/2 in the case of an even number and becomes (3k+1)/2 in the case of an odd number. It is learned that the upper limit lengths of the cycles which have to be considered become 3k−1 and 3k. Here, entering $L_{min}$=2k, if considering the case where k is an odd number and an even number all together, the upper limit length in question is derived as $$L_0 = L_{min} + \lfloor (L_{min}-2)/4 \rfloor$$

The invention claimed is:

1. A parity check matrix construction method for constructing a non-binary parity check matrix defining a non-binary LDPC code, comprising:
setting a binary parity check matrix of a binary LDPC code having a same configuration as said non-binary parity check matrix,
detecting cycles included in said set binary parity check matrix, and
selecting non-binary elements in partial matrices corresponding to the cycles detected in said set binary parity check matrix in said non-binary parity check matrix so that determinants for the partial matrices do not become 0,
said selected non-binary elements forming non-zero elements in the non-binary parity check matrix.

2. A parity check matrix construction method as set forth in claim 1, wherein, said binary parity check matrix is selected and set from a plurality of binary parity check matrices constructed by a known algorithm.

3. A parity check matrix construction method as set forth in claim 1, wherein, loops comprising pluralities of elements 1 in said binary parity check matrix comprising elements 0 and the elements 1 successively connected along the row direction and column direction are detected as cycles.

4. A parity check matrix construction method as set forth in claim 3, wherein, lengths of detected loops are restricted to not more than a predetermined upper limit length.

5. A parity check matrix construction method as set forth in claim 4, wherein
said upper limit length is $$L_{min} + 2$$

where,
$L_{min}$ indicates the length of the shortest cycle in the cycles included in said binary parity check matrix and
indicates, when expressing X as that this is the highest integer not exceeding X.

6. A parity check matrix construction method as set forth in claim 1, wherein the selection is performed to assign one of the non-binary elements constituted by n-ary elements to elements 1 in elements forming the cycles in said set binary parity check matrix comprising elements 0 and elements 1.

7. A parity check matrix construction method as set forth in claim 6, further comprising
executing said selection by assigning one of the n-ary elements to the previous elements 1 and
selecting one of the n-ary elements so that the determinants for the partial matrices corresponding to the cycles do not become zero only when assigning one of the n-ary elements to a last remaining unselected element 1.

8. A parity check matrix construction method as set forth in claim 7, wherein one of said n-ary elements is randomly assigned to the elements 1 until the last remaining unselected element 1.

9. A parity check matrix construction method as set forth in claim 1, wherein said binary parity check matrix and said non-binary parity check matrix are both matrices of column weight 2.

10. A parity check matrix construction system for constructing a non-binary parity check matrix defining a non-binary LDPC code, comprising
a matrix setter for setting a binary parity check matrix of a binary LDPC code having the same configuration as said non-binary parity check matrix,
a detector for detecting cycles included in said set binary parity check matrix,
a selector for selecting non-binary elements in a partial matrix so that the determinants of the partial matrices corresponding to said cycles detected in said set binary parity check matrix in said non-binary parity check matrix do not become 0, and
a parity check matrix output unit for determining non-zero elements in the non-binary parity check matrix by said selected non-binary elements and outputting said non-binary parity check matrix.

11. A transmitter including
an LDPC encoder receiving as input information bits to be encoded and transmitted and coding the same by a non-binary LDPC code,
a coding side parity check matrix holder for holding a non-binary parity check matrix used at the time of said coding, and
a modulator for modulating said encoded information bits from said LDPC encoder and transmitting them to the reception side, wherein
said coding side parity check matrix holder holds a non-binary parity check matrix constructed by a parity check matrix construction system, and
said parity check matrix construction system is a parity check matrix construction system comprised of (i) a matrix setter for setting a binary parity check matrix of a binary LDPC code having a same configuration as said non-binary parity check matrix, (ii) a detector for detecting cycles included in said set binary parity check matrix, (iii) a selector for selecting the non-binary elements in partial matrices corresponding to said cycles detected in said set binary parity check matrix in said non-binary parity check matrix so that the determinants of the partial matrices do not become 0, and (iv) a parity check matrix output unit for determining non-zero elements in the non-binary parity check matrix by said selected non-binary elements and outputting said non-binary parity check matrix.

12. A transmitter as set forth in claim 11, provided with:
an input side converter provided at an input side of said LDPC encoder for converting the binary data constituted by said input information bits to non-binary n-ary symbols and
an output side converter provided at an output side of said LDPC encoder for converting said information bits comprised non-binary n-ary symbols encoded by said LDPC encoder to said binary data.

13. A receiver comprising:
a demodulator receiving information bits encoded by a non-binary LDPC code, modulated, and transmitted by a transmitting side and demodulating same,
an LDPC decoder for decoding demodulated bits expressed by logarithmic likelihood from said demodulator by a non-binary LDPC code, and
a decoding side parity check matrix holder for holding a non-binary parity check matrix used at a time of decoding, wherein
said decoding side parity check matrix holder holds the non-binary parity check matrix which is identical to the one used at transmitter side, wherein
the parity check matrix is contructed at transmitter side by:
setting a binary parity check matrix of a binary LDPC code having a same configuration as said non-binary parity check matrix,
detecting cycles included in said set binary parity check matrix, and
selecting non-binary elements in partial matrices corresponding to the cycles detected in said set binary parity check matrix in said non-binary parity check matrix so that determinants for the partial matrices do not become 0,
said selected non-binary elements forming non-zero elements, in the non-binary parity check matrix.

14. A receiver as set forth in claim 13, provided with:
an input side converter provided at an input side of said LDPC decoder for converting binary demodulated bits expressed by likelihood from said demodulator to non-binary n-ary symbols and
an output side converter provided at an output side of said LDPC decoder for converting said information bits comprised of non-binary n-ary symbols decoded by said LDPC decoder to said binary data.

15. A transmitter where the transmission information to be encoded and transmitted includes first transmission information of a long code length and second transmission information of a shorter code length than said first transmission information and requiring a higher quality than said first information, provided with:
a binary LDPC encoder for receiving as input said first transmission information and coding this by a binary LDPC code,
a non-binary LDPC encoder for receiving as input said second transmission information and coding this by a non-binary LDPC code,
a first modulator for modulating encoded output from said binary LDPC encoder,
a second modulator for modulating encoded output from said non-binary LDPC encoder, and
a transmitting means for combining modulated outputs from said first and second modulator and transmitting the result to a reception side,
said non-binary LDPC encoder performing said coding by a non-binary parity check matrix constructed by a parity check matrix construction system,
said parity check matrix construction system being a parity check matrix construction system comprising (i) a matrix setter for setting a binary parity check matrix of a binary LDPC code having a same configuration as said non-binary parity check matrix, (ii) a detector for detecting cycles included in said set binary parity check matrix, (iii) a selector for selecting the non-binary elements in partial matrices corresponding to said cycles detected in said set binary parity check matrix in said non-binary parity check matrix so that the determinants of the partial matrices do not become 0, and (iv) a parity check matrix output unit for determining non-zero elements in the non-binary parity check matrix by said selected non-binary elements and outputting said non-binary parity check matrix.

16. A transmitter as set forth in claim 15, wherein
said binary LDPC encoder receives as input information bits in wireless communication as said first transmission information, and
said non-binary LDPC encoder receives as input control information in wireless communication as said second transmission information.

17. A transmitter as set forth in claim 15, wherein
said binary LDPC encoder receives information bits in wireless communication as said first transmission information, and said non-binary LDPC encoder receives as input broadcast information in wireless communication as said second transmission information.

18. A transmitter as set forth in claim 15, further provided with:
- an input side converter provided at an input side of said binary LDPC encoder for converting binary data constituted by said first transmission information to non-binary n-ary symbols and
- an output side converter provided at an output side of said non-binary LDPC encoder for converting said second transmission information bits comprising non-binary n-ary symbols encoded by said non-binary LDPC encoder to said binary data.

19. A receiver receiving and separately reproducing said first transmission information and said second transmission information transmitted by the transmitter as set forth in claim 15.

* * * * *